United States Patent [19]

Moyer

[11] Patent Number: 4,775,876
[45] Date of Patent: Oct. 4, 1988

[54] PHOTON RECYCLING LIGHT EMITTING DIODE

[75] Inventor: Curtis D. Moyer, Phoenix, Ariz.

[73] Assignee: Motorola Inc., Schaumburg, Ill.

[21] Appl. No.: 93,851

[22] Filed: Sep. 8, 1987

[51] Int. Cl.[4] ............................................. H01L 33/00
[52] U.S. Cl. ........................................ 357/17; 357/16; 357/4
[58] Field of Search ..................... 357/16, 4, 17, 30 B, 357/30 E, 30 R, 30 L

[56] References Cited

U.S. PATENT DOCUMENTS

| 4,438,447 | 3/1984 | Copeland, III et al. | 357/17 X |
| 4,476,477 | 10/1984 | Capasso et al. | 357/30 |
| 4,568,959 | 2/1986 | Chang et al. | 357/16 X |
| 4,680,602 | 7/1987 | Watanabe et al. | 357/17 |
| 4,694,312 | 9/1987 | Yamazaki | 357/17 |

FOREIGN PATENT DOCUMENTS

| 59-90978 | 5/1984 | Japan | 357/4 |
| 59-136981 | 8/1984 | Japan | 357/30 E |
| 61-95576 | 5/1986 | Japan | 357/4 |

OTHER PUBLICATIONS

Tsarenkov et al., "Red-Light Emitting Diodes Based on Variable-Gap $Ga_{1-x}Al_xAs$:Si p-n Structures," *Soviet Physics-Semiconductors*, vol. 6, No. 5, (Nov. 1972), 793-7.

*Primary Examiner*—William D. Larkins
*Assistant Examiner*—William A. Mintel
*Attorney, Agent, or Firm*—Joe E. Barbee

[57] ABSTRACT

A photon recycling light emitting diode consisting of a stack of direct bandgap semiconductor active layers on a substrate with increasing bandgap energy from the substrate, separated by barrier layers having higher bandgap energy and capped with a window layer having a bandgap energy higher than the active layers.

10 Claims, 1 Drawing Sheet

PHOTON RECYCLING LIGHT EMITTING DIODE

BACKGROUND OF THE INVENTION

The present invention pertains to a device and method for recycling photons in a light emitting diode. In light emitting diodes (LED) photons are created by the biasing of a P-N junction. Electrons flow from the N-doped material to the P-doped material. Once in the P-doped material, the electrons combine with holes to emit photons. These photons are emitted in every direction, with a very small percentage reaching the edges of the LEDs and escaping to contribute to the external efficiency of the device. Only weakly absorbed photons have a relatively high probability of escaping, and reduced absorption can be realized only if the photon energy is substantially less than the bandgap energy of the material through which the photon must pass.

In prior art, graded bandgap LEDs, such as that in Dawson "High-efficiency graded-band-gap $Ga_{1-x}Al_xAs$ light-emitting diodes" *J. Appl. Phys.*, Vol. 48, No. 6, June 1977, attempt to increase the external efficiency. Dawson used liquid phased epitaxy to grow a P-N junction on a substrate. The P-N junction is formed during the growth of a single epitaxial layer. This arises from the fact that silicon is an amphoteric dopant in gallium aluminum arsenide (GaAlAs) grown from Ga rich solutions, substituting in greater numbers on Ga and Al sites (as donors) at high growth temperature or As sites (as acceptors) at low growth temperature. By cooling a Ga, Al, As, Si solution in contact with the GaAs substrate through the N to P transition temperature, a P-N junction is formed without removal of the solid from the growth system and without changing the growth liquid composition.

In LED's, photons escape the device through an exit surface referred to here as the window. In Dawson, the internal absorption of photons moving towards the window is reduced by the use of a graded bandgap. The graded bandgap arises because of a variation in the amount of Al incorporated during the growth of these thick epitaxial layers. Under these growth conditions, Al segregates strongly in favor of the solid, leading to a decrease in AlAs mole fraction as growth proceeds due to depletion of Al from the bulk of the liquid.

This graded bandgap means that the bandgap energy, as the photon approaches the window, is increasing in the material through which the photon is moving. The bandgap energy of the material, being higher than the energy of the photon, means that the internal absorption of the photon is reduced. Also, the photons not headed toward the window are reabsorbed deeper in the device away from the window due to the reduction of the bandgap energy in that direction. These reabsorbed photons will then generate electron hole pairs. The photogenerated then recombine with holes to emit more photons with the lower energy of the bandgap of the material at the greater depth. These photons have less energy than the previous photons; therefore, the photons of this group moving towards the window again have energy lower than the material bandgap through which they pass thus having less chance to be absorbed. This cycle continues depending on the thickness of the layer. While this device increases the external efficiency, it has some problems.

There are problems with graded bandgap LEDs. In order for the graded bandgap to be in the correct direction with the highest bandgap energy by the window, the substrate must be removed. Substrate removal is an expensive and time consuming process. Furthermore, since the substrate is removed, the grown layer must be thick enough to survive structurally. Also, while the photons are recycled, the energy reduction from one photon to the next can be quite substantial thereby reducing the number of cycles that can occur. This is due to the electron moving a substantial distance down the bandgap energy gradient before recombination with holes can occur.

SUMMARY OF THE INVENTION

The present invention pertains to a photon recycling light emitting diode. This device consists of a substrate on which a plurality of stacked active layers are formed. The active layer closest to the substrate has the lowest bandgap energy with the subsequent layers each increasing in bandgap energy over the preceding layer, from the substrate. Alternatively interspersed between active layers are barrier layers which also have increased bandgap energy as they progress from the substrate, but the barrier layers also have substantially higher bandgap energy than the adjacent active layers. A window layer is located on the stack of active and barrier layers and when biased, injects electrons into the adjacent active layer.

It is an object of the present invention to provide a new and improved photon recycling light emitting diode.

It is a further object of the present invention to provide a faster photon recycling light emitting diode.

It is a further object of the present invention to provide a photon recycling light emitting diode with lower production costs.

These and other objects of the present invention will become apparent to those skilled in the art upon consideration of the accompanying specification, claims and drawings.

DESCRIPTION OF THE PREFERRED EMBODIMENT

Figure 1:
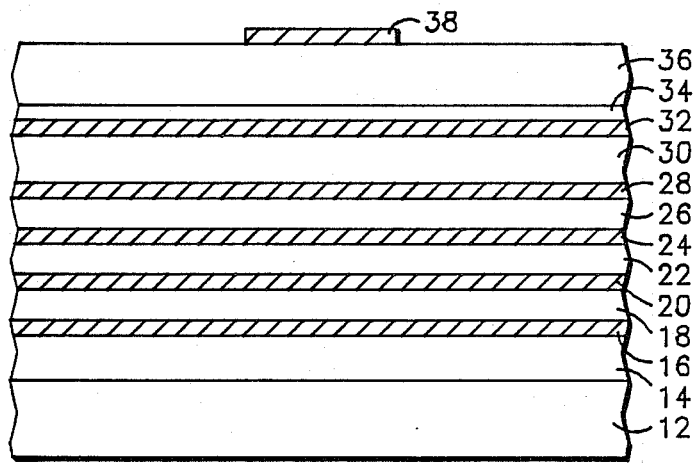
FIG. 1 is a cutaway side view of a photon recycling LED embodying the present invention.

Referring now to the drawings, FIG. 1 is a cross-sectional side view of a photon recycling LED embodying the present invention. It illustrates a GaAs substrate 12 upon which a plurality of stacked layers are formed. The first layer 14 is a buffer of GaAs. In this embodiment, five barrier layers, 16, 20, 24, 28 and 32, and five active layers, 18, 22, 26, 30 and 34 are formed upon buffer layer 14 starting with barrier layer 16. Barrier layer 16 is P-doped GaAlAs with 15% AlAs mole fraction. Active layer 18 which is formed on barrier layer 16 is P-doped GaAs. A barrier layer 20 is formed on active layer 18 and is GaAlAs with 20% AlAs mole fraction. Active layer 22 is formed on barrier layer 20 and is P-doped GaAlAs with 5% AlAs mole fraction. Barrier layer 24 is formed on active layer 22 and is P-doped GaAlAs with 25% AlAs mole fraction. Active layer 26 is formed on barrier layer 24 and is P-doped GaAlAs with 10% AlAs mole fraction. Barrier layer 28 is formed on active layer 26 and is P-doped GaAlAs with 30% AlAs mole fraction. Active layer 30 is formed on barrier layer 28 and is P-doped GaAlAs with 15% AlAs mole fraction. Barrier layer 32 is formed on active layer 30 and is P-doped GaAlAs with 35% AlAs mole fraction. Active layer 34 is formed on barrier layer 32 and is P-doped GaAlAs with 20% AlAs mole fraction. In this embodiment, barrier layers 16, 20, 24, 28 and 32 are approximately 0.2 microns thick. It should be understood by one skilled in the art, that these barrier layers may be thicker but this would be unnecessary and increase the size and cost of this device or the barrier layers may be thinner limited by the need to prevent tunnelling. Active layers 18, 22, 26 and 30 are approximately 1 to 2 microns thick. Active layer 34 is approximately 0.1 to 0.2 microns thick. An N-doped GaAlAs window layer 36 with 35% AlAs mole fraction is formed on active layer 34.

An N-doped GaAs cap is formed over a contact area of window layer 36. The area covered by the cap is as small as possible while still allowing a low resistance path from the top metal to window layer 36. Cap 38 is used because GaAlAs oxidizes very quickly and window layer 36 would be insulated from a contact before it could be put on if cap 38 were not in place. It should be understood by one skilled in the art that while a cap is used here, if a material not as readily oxidized as GaAlAs were used or new metallization techniques were developed the cap would become unnecessary.

GaAs is a direct bandgap material, which will produce photons from the recombination of electrons with holes. GaAlAs is also a direct bandgap material, for the AlAs mole fractions cited in the preferred embodiment, but the presence of Al changes the bandgap energy of the material. The higher the Al content, the greater the bandgap energy will be. In this embodiment there is a 5% AlAs mole fraction difference between active layers. This gives substantial opportunity for reabsorption recycling of photons in the next deeper active layer. The active layers are limited in number due to a 30% AlAs mole fraction limitation for the active layers set by the requirement of low resistivity direct gap material of sufficient bandgap for the window. The 30% AlAs mole fraction limitation is in the active layers. Above 30% AlAs mole fraction, the material will not emit as much light, with much of the energy dissipated as heat and significantly higher resistivities are obtained. Absorption of photons is reduced if the photon energy is less than the bandgap energy of the material through which the photon is moving, and if the energy of the photon is substantially less, then the material becomes transparent to the photon. Thus, barrier layers 16, 20, 24, 28 and 32 of FIG. 1 are transparent to photons, as well as window 36, which allows photons to escape the device. Active layers 18, 22, 26, 30 and 34 also have different Al content, thus, having differing bandgap energies and resulting in emitted photons with varied energies depending on the active layer in which they are produced.

In the preferred embodiment of the present invention, a current is introduced into window 36. This layer must be thick enough to evenly distribute the charge, and have a high enough Al content to be transparent to photons. Electrons are then injected into active layer 34 which may be very thin since there is no desired absorption of photons in this layer. The electrons are restricted to layer 34 by barrier layer 32 until recombination with a hole can occur. At this time, a photon is emitted, with a few percent (approximately 2%) escaping the structure and the remainder being internally reflected or propagated to active layer 30. These photons are able to pass through barrier layer 32 because their energy is less than the bandgap energy of that layer.

Figure 2:
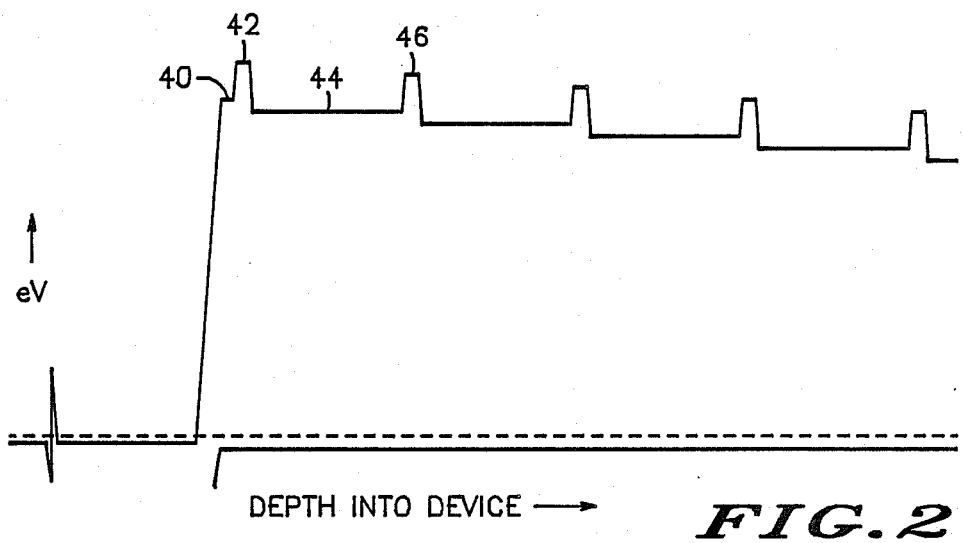
FIG. 2 is a conduction band diagram of the recycling LED illustrated in FIG. 1.

The bandgap energies from the device are shown in FIG. 2. Plateau 40 is the bandgap energy of active layer 34. Peak 42 is the bandgap energy of barrier layer 32. The initially injected electrons have energies approximately that of plateau 40 and thus, cannot overcome the barrier of the bandgap energy of peak 42. Thus, the electron is restricted until it recombines with the hole and a photon is emitted. Active layer 30 has a reduced Al content and thus, a lower bandgap energy is reflected in FIG. 2 by plateau 44. Thus, photons from active layer 34 entering layer 30 have energy greater than the bandgap of layer 30 and can be absorbed. The rest of the active layers are thicker than active layer 34 because of the need for absorption, although since the photon is higher energy, absorption readily occurs. The absorption of a photon into active layer 30 creates an electron hole pair. The energy of the electron is now approximately the same as the bandgap energy of active layer 30 shown in FIG. 2 as plateau 44. The electron cannot flow down the energy gradient to lower energy states due to barrier layer 28 which has a bandgap energy higher than the energy of the electron as shown in FIG. 2 as peak 46. This occurs through all the active layers of the device with the photons generated, gradually having less energy. The repeated absorption and re-emission of photons constitutes the photon recycling process which increases external efficiency by facilitating repeated chances for the photons to escape the structure.

Figure 3:
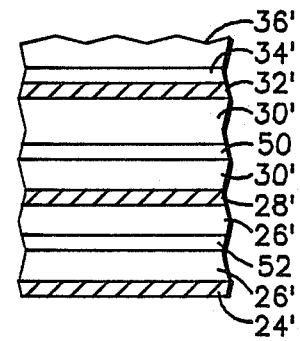
FIG. 3 is a cutaway sideview of a second embodiment of the present invention.

FIG. 3 is a second embodiment of the present invention in which energy wells are formed in active layers. In FIG. 3 a cutaway portion of a second embodiment is illustrated with energy wells 50 and 52 located in active layers 30' and 26' respectively. These active layers are bounded by higher bandgap energy barrier layers 24', 28', and 32'. Active layer 34' nearest to window 36' is very thin since no photon absorption is required in it. Therefore it has no need of an energy well. The embodiment shown in FIG. 1 may have poor optical recombination efficiency because its active layers must be thick enough for absorption, but thick active layers spread the electrons over a large volume allowing them to recombine with a large number of bulk defects. An energy well placed in the center of an active layer will confine the electrons to a smaller volume raising the concentration of carriers compared to the number of defects. This will offer a faster and more efficient recombination. This band structure, if done in GaAlAs, requires an AlAs mole fraction difference of $-5\%$ between prior well and next absorption region plus an AlAs mole fraction difference of $-5\%$ between the well and its absorbing layers for a net AlAs mole fraction difference of approximately $-10\%$ per active well layer. This limits the number of recycling layers to approximately half that of the prior embodiment of FIG. 1. Thus, a trade off between layer efficiency and total number of recycling layers may exist.

Figure 4:
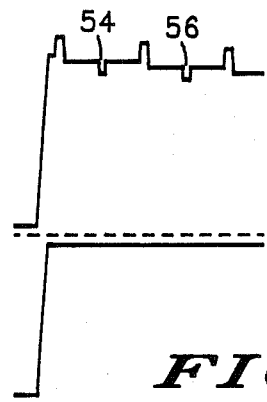
FIG. 4 is a conduction band diagram of the photo recycling LED illustrated in FIG. 3.

FIG. 4 illustrates the bandgap energies from the structure in FIG. 3. Energy wells 54 and 56 are seen to be depressions in the bandgap energies of the active layers.

Speed of the Dawson LED previously cited is limited to a few hundred ns 10–90% rise time due to the use of silicon as the dopant which forms a deep acceptor that acts as a slow recombination center. The preferred embodiment presented here does not require the use of silicon for the p-type dopant and may be constructed with germanium or zinc dopants (for example) used at high concentrations yielding speed improvements of ~10×.

There is thus provided by the present invention a substantially improved photon recycling light emitting diode. Also, since the bandgap energy increases in the active layers with the layers furthest from the substrate having the highest bandgap energy, it is not necessary to remove the substrate, thus, reducing the cost and time of the production of the device and also allowing for thinner layers since they are supported by a substrate and do not need to support themselves. Further, due to its ability to recycle photons efficiently and quickly, the device is substantially faster than the prior art devices and has a high external efficiency.

Having thus described the invention, it will be apparent to those skilled in the art that various modifications can be made within the spirit and scope of the present invention. For example, while GaAlAs was used in the preferred embodiments, any material system capable of absorption, emission and varying bandgap could be usable. Also, the number of layers and the percent of AlAs mole fraction may be varied to obtain optimal efficiency. Further, a substitution of n-layers for p-layers and p-layers for n-layers falls within the spirit of the invention. While the preferred embodiment describes barrier layers of varying AlAs mole fraction, a single sufficient AlAs mole fraction may be selected for all barrier layers.

I claim:

1. A photon recycling light emitting diode comprising:
    a substrate made of a semiconductor material;
    a plurality of active layers located on the substrate, wherein said active layers are made of a semiconductive material;
    each successive active layer from said substrate having an increased bandgap energy over the bandgap energy of the preceding active layer;
    a plurality of barrier layers alternately interspersed between said active layers, wherein said barrier layers are made of a semiconductor material;
    each successive barrier layer from said substrate having a substantially higher bandgap energy than the bandgap energy of adjacent active layers;
    a window layer located on the active layer furthest from said substrate, wherein said window layer is made of a semiconductor material of opposite conductivity type than the active and barrier layers; and
    said window layer having a bandgap energy higher than the bandgap energy of any of the active layers.

2. A diode as claimed in claim 1 wherein the active layers, barrier layers, and window layer are formed from a direct bandgap semiconductor material.

3. A diode as claimed in claim 2 wherein the direct bandgap semiconductor material is a variable bandgap material.

4. A diode as claimed in claim 3 wherein said variable bandgap material is GaAlAs.

5. A diode as claimed in claim 3 wherein said increased bandgap energy in said active and said barrier layers is due to an increased content of Al in the GaAlAs.

6. A photon recycling light emitting diode comprising:
    a substrate made of a semiconductor material;
    a plurality of active layers located on the substrate, wherein said active layers are made of a semiconductor material;
    each successive active layer from said substrate having an increased bandgap energy over the bandgap energy of the preceding active layer;
    each of said active layers having an energy well that has a lower bandgap energy than the active layer in which it is located, said well in each active layer having a higher bandgap energy than the bandgap energy in the adjacent well and also in an absorbing active layer closer to the substrate;
    a plurality of barrier layers alternately interspersed between said active layers, wherein said barrier layers are made of a semiconductor material;
    each successive barrier layer from said substrate having a substantially higher bandgap energy than the bandgap energy of adjacent active layers and;
    a window layer located on the active layer furthest from said substrate, and having a bandgap energy higher than the bandgap energy of any of the active layers, wherein said window layer is made of a semiconductor material.

7. A diode as claimed in claim 5 wherein the active layers, wells, window layer and barrier layers are formed from a direct bandgap semiconductor material.

8. A diode as claimed in claim 6 wherein said direct bandgap semiconductor material is a variable bandgap material.

9. A diode as claimed in claim 8 wherein said variable bandgap material is GaAlAs.

10. A diode as claimed in claim 7 wherein said increased bandgap energy in said active layers, wells, and barrier layers is due to an increased content of Al in the GaAlAs.

* * * * *